(12) United States Patent
Hayes et al.

(10) Patent No.: US 8,168,885 B2
(45) Date of Patent: *May 1, 2012

(54) LOW MODULUS SOLAR CELL ENCAPSULANT SHEETS WITH ENHANCED STABILITY AND ADHESION

(75) Inventors: Richard Allen Hayes, Beaumont, TX (US); Geraldine M. Lenges, Wilmington, DE (US); Steven C. Pesek, Orange, TX (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 664 days.

This patent is subject to a terminal disclaimer.

(21) Appl. No.: 11/705,196

(22) Filed: Feb. 12, 2007

(65) Prior Publication Data

US 2008/0190481 A1    Aug. 14, 2008

(51) Int. Cl.
*H01L 31/048* (2006.01)
(52) U.S. Cl. ............. 136/251; 136/259; 438/51; 156/99
(58) Field of Classification Search .................. 136/251; 438/28
See application file for complete search history.

(56) References Cited

U.S. PATENT DOCUMENTS

| | | | |
|---|---|---|---|
| 3,957,537 A | 5/1976 | Baskett et al. | |
| 5,476,553 A * | 12/1995 | Hanoka et al. | ................ 136/251 |
| 5,478,402 A | 12/1995 | Hanoka | |
| 5,582,653 A | 12/1996 | Kataoka et al. | |
| 5,728,230 A | 3/1998 | Komori et al. | |
| 5,733,382 A | 3/1998 | Hanoka | |
| 5,741,370 A | 4/1998 | Hanoka | |
| 5,762,720 A | 6/1998 | Hanoka et al. | |
| 5,986,203 A | 11/1999 | Hanoka et al. | |
| 6,075,202 A | 6/2000 | Mori et al. | |
| 6,114,046 A * | 9/2000 | Hanoka | ........................ 428/515 |
| 6,187,448 B1 | 2/2001 | Hanoka et al. | |
| 6,232,544 B1 | 5/2001 | Takabayashi | |
| 6,319,596 B1 | 11/2001 | Kernander et al. | |
| 6,320,116 B1 | 11/2001 | Hanoka | |
| 6,353,042 B1 | 3/2002 | Hanoka et al. | |
| 6,372,352 B1 * | 4/2002 | Bletsos et al. | ................ 428/441 |
| 6,414,236 B1 | 7/2002 | Kataoka et al. | |
| 6,586,271 B2 | 7/2003 | Hanoka | |
| 6,690,930 B1 | 2/2004 | Dupre | |
| 6,693,237 B2 | 2/2004 | Zenko et al. | |
| 6,940,008 B2 | 9/2005 | Shiotsuka et al. | |
| 7,479,327 B2 * | 1/2009 | Domine | ........................ 428/523 |

(Continued)

FOREIGN PATENT DOCUMENTS

CA    2 388 107    4/2002

(Continued)

OTHER PUBLICATIONS

Moad, G., The Synthesis of Polyolefin Graft Copolymers by Reactive Extrusion, Progress in Polymer Science, vol. 24, pp. 81-142, 1999.*

(Continued)

*Primary Examiner* — Jeffrey T Barton
*Assistant Examiner* — Jayne Mershon

(57) ABSTRACT

The present invention provides a pre-formed bi-layer thermoplastic film or sheet comprising a first surface layer made of acid copolymers, or ionomers, or combinations thereof and a second surface layer made of ethylene acrylate ester copolymers, a solar cell pre-laminate assembly comprising the same, and a simplified process for manufacturing a solar cell module derived therefrom.

21 Claims, 1 Drawing Sheet

U.S. PATENT DOCUMENTS

| | | | |
|---|---|---|---|
| 2002/0068137 A1* | 6/2002 | Paleari et al. | 428/34.9 |
| 2003/0000568 A1 | 1/2003 | Gonsiorawski | |
| 2003/0124296 A1 | 7/2003 | Smith | |
| 2004/0054087 A1* | 3/2004 | Akada et al. | 525/222 |
| 2004/0144415 A1 | 7/2004 | Arhart | |
| 2004/0191422 A1 | 9/2004 | Kataoka et al. | |
| 2005/0279401 A1* | 12/2005 | Arhart et al. | 136/251 |
| 2006/0057392 A1 | 3/2006 | Smillie et al. | |
| 2006/0084763 A1 | 4/2006 | Arhart et al. | |
| 2006/0141212 A1 | 6/2006 | Smith et al. | |
| 2006/0165929 A1 | 7/2006 | Lenges et al. | |
| 2007/0141366 A1* | 6/2007 | Rivett et al. | 428/457 |
| 2008/0023064 A1 | 1/2008 | Hayes et al. | |
| 2009/0023867 A1 | 1/2009 | Nishijima et al. | |
| 2009/0120489 A1* | 5/2009 | Nishijima et al. | 136/251 |

FOREIGN PATENT DOCUMENTS

| | | |
|---|---|---|
| EP | 0 769 818 A2 | 4/1997 |
| EP | 1 235 683 B1 | 9/2002 |
| EP | 0 755 080 B1 | 2/2005 |
| EP | 1 544 921 A1 | 6/2005 |
| EP | 1 182 710 B1 | 6/2006 |
| JP | 56-116047 | 7/1981 |
| JP | 63-244374 | 9/1988 |
| JP | 05-186610 * | 7/1993 |
| JP | 3510645 B2 | 10/1994 |
| JP | 06-322334 A | 11/1994 |
| JP | 3510646 B2 | 11/1994 |
| JP | 08-316508 A | 11/1996 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-064268 | 3/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-186233 A | 7/2006 |
| JP | 2006-186237 A | 7/2006 |
| JP | 2006-190865 A | 7/2006 |
| JP | 2006-190867 A | 7/2006 |
| WO | WO 91/01880 | 2/1991 |
| WO | WO 03/057478 A1 | 7/2003 |
| WO | 2006/085603 A1 | 8/2006 |
| WO | 2006/095762 A1 | 9/2006 |
| WO | WO 2006/095762 * | 9/2006 |

OTHER PUBLICATIONS

Baum, Bernard et al., Solar Collectors Final Report, Jun. 1983, DOE/CS/35359-T1 (DE84011488), Contract No. AC04-78CS35359, Springborn Laboratories, Inc., Enfield, Connecticut.

Willis, Paul B., Investigation of Materials and Processes for Solar Cell Encapsulation Final Report, Aug. 1986, DOE/JPL-954527-86/29, Distribution Category CC-63, JPL Contract 954527, S/L Project 6072.1, Springborn Laboratories, Inc., Enfield, Connecticut.

U.S. Appl. No. 11/796,858, filed Apr. 30, 2007.
U.S. Appl. No. 11/588,628, filed Oct. 27, 2006.
U.S. Appl. No. 11/491,341, filed Jul. 21, 2006.
U.S. Appl. No. 11/512,825, filed Aug. 30, 2006.
U.S. Appl. No. 11/495,391, filed Jul. 28, 2006.
U.S. Appl. No. 11/495,249, filed Jul. 28, 2006.
U.S. Appl. No. 11/386,143, filed Mar. 21, 2006.
Abstract of EP 1 235 683, published Sep. 4, 2002, Applicant—Huels Troisdorf.

* cited by examiner

LOW MODULUS SOLAR CELL ENCAPSULANT SHEETS WITH ENHANCED STABILITY AND ADHESION

FIELD OF THE INVENTION

The present invention relates to certain low modulus thermoplastic bi-layer films or sheets with enhanced stability and adhesion and their utility in manufacturing solar cell modules.

BACKGROUND OF THE INVENTION

As a renewable energy resource, the use of solar cell modules is rapidly expanding. With increasingly complex solar cell modules, also referred to as photovoltaic modules, comes an increased demand for enhanced functional encapsulant materials. Photovoltaic (solar) cell modules or laminates are units that convert light energy into electrical energy. A typical or conventional solar cell pre-laminate assembly consists of at least 4 or 5 structural layers. As shown in FIG. 1, they are constructed in the following order starting from the top, or incident layer (that is, the layer first contacted by light) and continuing to the backing (the layer furthest removed from the incident layer): (1) incident layer 11, (2) front-sheet encapsulant layer 12, (3) voltage-generating layer (or solar cell layer) 13, (4) back-sheet encapsulant layer (optional) 14, and (5) backing layer 15. The function of the incident layer is to provide a transparent protective window that will allow sunlight into the solar cells. The incident layer is typically a glass plate or a thin polymeric film, such as a fluoropolymer film, but could conceivably be any material that is transparent to sunlight.

The solar cell encapsulant layers are designed to encapsulate and protect the fragile solar cells. Generally, a solar cell pre-laminate assembly will incorporate at least two encapsulant layers sandwiched around the solar cells. The optical properties of the front-sheet encapsulant layer must be such that light can be effectively transmitted to the voltage-generating layer. Over the years, a wide variety of polymeric interlayers have been developed to be used as encapsulant layers. In general, these polymeric interlayers must possess a combination of characteristics including very high optical clarity, low haze, high impact resistance, shock absorbance, excellent ultraviolet (UV) light resistance, good long term thermal stability, excellent adhesion to glass and other solar cell laminate layers, low UV light transmittance, low moisture absorption, high moisture resistance, excellent long term weatherability, among other requirements. Widely used encapsulant materials include complex, multi-component compositions based on ethylene vinyl acetate (EVA), ionomer, poly(vinyl butyral) (PVB), polyurethane (PU), polyvinylchloride (PVC), polyethylene (e.g., metallocene-catalyzed linear low density polyethylene), polyolefin block elastomers, ethylene acrylate ester copolymers (e.g., poly(ethylene-co-methyl acrylate) and poly(ethylene-co-butyl acrylate)), acid copolymers, silicone elastomers, epoxy resins, and the like.

Ethylene vinyl acetate compositions, which have commonly been utilized as the encapsulant material within solar cell modules, suffer the shortcomings of low adhesion to the other components incorporated within the solar cell module, low creep resistance during the lamination process and end-use and low weathering and light stability. These shortcomings have generally been overcome through the formulation of adhesion primers, peroxide curing agents, and thermal and UV stabilizer packages into the ethylene acetate compositions, which complicates the sheet production and ensuing lamination processes.

A more recent development has been the use of higher modulus ethylene copolymer ionomers within solar cell construction, see, e.g., U.S. Pat. Nos. 5,476,553; 5,478,402; 5,733,382; 5,741,370; 5,762,720; 5,986,203; 6,114,046; 6,319,596; 6,320,116; 6,353,042; and 6,586,271; and 6,690,930, U.S. Patent Application No. 2003/0000568, Japanese Patent Nos. JP S56-116047 and JP H2-94574(A), and "Solar Collectors, Final Report", DOE/CS/35359-T1 (DE84011480), DOE6081.1, Contract No. AC4-78CS35359 (Springborn Laboratories, Inc.), June 1983.

However, none of the currently known encapsulant layer materials can encompass all of the end-use requirements. Ionomer compositions have excellent weatherability and adhesion to other solar cell laminate layers, such as glass, but tend to be high modulus with reduced shock absorbance imparted to the solar cells.

There is a continuing need to provide solar cell encapsulant material which provide adequate protection to the solar cell, have a long lifetime within the end-use and provide adequate adhesion to the other solar cell laminate layers, preferably without the use of adhesion primers to simplify the production processes. The use of certain ethylene acrylate ester copolymers as solar cell encapsulants has been considered since essentially the inception of solar cell modules, see, e.g., U.S. Pat. Nos. 3,957,537; 5,582,653; 5,728,230; 6,075,202; 6,232,544; and 6,940,008, European Patent Nos. EP 0 755 080 and EP 1 544 921, and U.S. Patent Application No. 2004/0191422.

However, it has generally been found that ethylene acrylate esters do not provide adhesion to commonly utilized solar cell structural layers, such as glass. Ethylene acrylate copolymers are also not typically optically clear. For the very same reason, U.S. Pat. Nos. 6,414,236 and 6,693,237 teach against the use of ethylene acrylate ester copolymers as solar cell encapsulants. This shortcoming has usually been overcome through the addition of adhesion primers. In addition, the ethylene acrylate ester materials have been found to creep under end-use conditions, such as in roof solar cell modules which can reach high temperatures. To overcome this shortcoming, the ethylene acrylate esters have been cross-linked, typically through the incorporation of organic peroxides with concurrent curing processes thereafter. For example, Willis, Paul B., in "Investigation Of Materials And Processes For Solar Cell Encapsulation", DOE/JPL-954527-86/29, JPL Contract 954527, S/L Project 6072.1, August, 1986, disclose solar cell encapsulants derived from peroxide cross-linked EMA, which requires the use of a primer for effective and reliable bonding to the other components.

Tailored multilayer solar cell encapsulant layers have been developed to provide each layer's best attributes, while reducing their shortcomings. However, care must be taken when designing multilayer solar cell encapsulant layers to avoid unforeseen shortcomings which detract from the overall desirability of the resultant encapsulant layer. For example, U.S. Pat. Nos. 6,114,046; 6,586,271; and 6,353,042 have disclosed a solar cell encapsulant sheet which includes a layer of metallocene polyethylene disposed between two layers of ionomer and U.S. Pat. Nos. 6,187,448 and 6,320,116 have disclosed a solar cell encapsulant sheet which includes a layer of metallocene polyethylene disposed between two layers of an acid copolymer of polyethylene. In both cases, the tri-layer encapsulant sheet suffers the shortcoming of appearing cloudy and light blue.

The present invention overcomes these shortcomings and provides tailored, low modulus solar cell encapsulant material which provides excellent protection to the solar cell from physical damage, excellent adhesion to the other solar cell laminate layers, and long term stability to thermal and UV degradation.

SUMMARY OF THE INVENTION

The present invention is directed to a thermoplastic bi-layer film or sheet comprising a first surface layer formed of an acid copolymer, an ionomer, or a combination thereof and a second surface layer formed of an ethylene acrylate ester copolymer.

In accordance to the present invention, the acid copolymer used herein comprises a finite amount of polymerized residues of an α-olefin and greater than or equal to about 1 wt % of polymerized residues of an α,β-ethylenically unsaturated carboxylic acid, based on a total weight of said acid copolymer; the ionomer used herein is a derivative of a parent acid copolymer comprising a finite amount of polymerized residues of an α-olefin and greater than or equal to about 10 wt % of polymerized residues of an α,β-ethylenically unsaturated carboxylic acid, based on a total weight of said parent acid copolymer and having about 10 to 100% of a total carboxylic acid content neutralized with metallic ions; and the ethylene acrylate ester copolymer used herein comprises a finite amount of polymerized residues of an α-olefin and greater than or equal to about 1 wt % of polymerized residues of an acrylate ester, based on a total weight of the ethylene acrylate ester copolymer. Moreover, it is preferred that at least one surface of the thermoplastic bi-layer film or sheet is a rough surface.

The present invention is further directed to a solar cell pre-laminate assembly comprising: (i) a front-sheet encapsulant layer, (ii) a solar cell layer comprising one or a plurality of electronically interconnected solar cells and having a light-receiving side and a rear side, and (iii) an optional back-sheet encapsulant layer, wherein at least one of the two encapsulant layers is formed of one layer of the thermoplastic bi-layer film or sheet disclosed herein.

The solar cell pre-laminate assembly disclosed herein may further comprise an incident layer serving as an outer layer to the light-receiving side of the assembly and/or a backing layer serving as an outer layer to the back side of the assembly.

The present invention is further directed to a solar cell pre-laminate assembly consisting essentially of, from top to bottom: (i) an incident layer made of transparent material, which is positioned adjacent to, (ii) a front-sheet encapsulant layer that is positioned adjacent to, (iii) a solar cell layer comprising one or a plurality of electronically interconnected solar cells, which is positioned adjacent to, (iv) a back-sheet encapsulant layer that is positioned adjacent to, (v) a backing layer, wherein at least one of the two encapsulant layers is formed of one layer of the thermoplastic bi-layer film or sheet disclosed herein.

The present invention is yet further directed to a process of manufacturing a solar cell module comprising: (i) providing a solar cell pre-laminate assembly as described above and (ii) laminating the assembly to form the solar cell module.

The present invention is yet further directed to a solar cell module prepared by the process described above.

DETAILED DESCRIPTION OF THE INVENTION

To the extent permitted by the United States law, all publications, patent applications, patents, and other references mentioned herein are incorporated by reference in their entirety.

The materials, methods, and examples herein are illustrative only and the scope of the present invention should be judged only by the claims.

Definitions

The following definitions apply to the terms as used throughout this specification, unless otherwise limited in specific instances.

When the term "about" is used in describing a value or an end-point of a range, the disclosure should be understood to include the specific value or end-point referred to.

The terms "finite amount" and "finite value", as used herein, are interchangeable and refer to an amount that is greater than zero.

In the present application, the terms "sheet" and "film" are used in their broad sense interchangeably.

Thermoplastic Bi-Layer Films or Sheets

Figure 1:
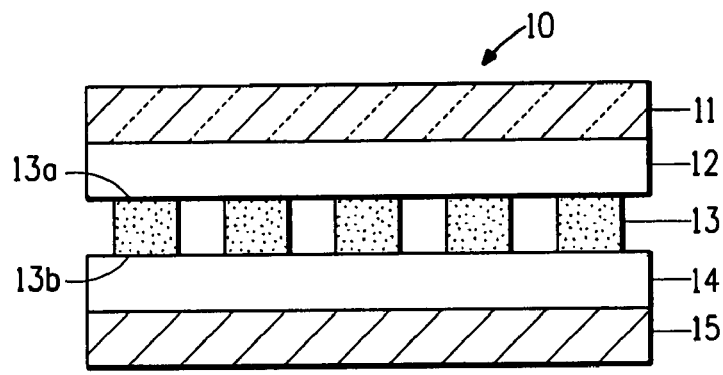
FIG. 1 is a cross-sectional view of a typical prior art solar cell pre-laminate assembly.
Figure 2:
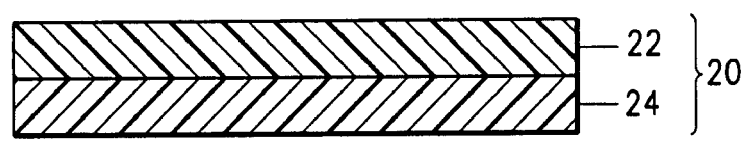
FIG. 2 is a cross-sectional view of the thermoplastic bi-layer film or sheet of the present invention, which comprises a first surface layer 22 formed of an acid copolymer, an ionomer or a combination thereof and a second surface layer 24 formed of an ethylene acrylate ester copolymer.

Now referring to FIG. 2, the present invention provides a thermoplastic bi-layer film or sheet 20 that is suitable for use in laminar structures. Preferably, the thermoplastic bi-layer film or sheet 20 may be included in a solar cell pre-laminate assembly as an encapsulant layer, which can be heated and be caused to form an adhesive bond with other encapsulant layer materials, flexible plastic materials, rigid materials, and/or solar cells.

As shown in FIG. 2, the thermoplastic bi-layer film or sheet 20 comprises two surface layers 22 and 24, wherein (i) the first surface layer 22 comprises a polymeric composition comprising an acid copolymer, an ionomer, or a combination thereof and (ii) the second surface layer 24 comprises a polymeric composition comprising an ethylene acrylate ester copolymer.

I. Acid Copolymers:

In accordance to the present invention, the acid copolymer used herein is a copolymer comprising a finite amount of polymerized residues of an α-olefin and greater than or equal to about 1 wt % of polymerized residues of an α,β-ethylenically unsaturated carboxylic acid based on the total weight of the acid copolymer. Preferably, the acid copolymer contains greater than or equal to about 10 wt %, or more preferably, greater than or equal to about 18 wt %, or most preferably, about 18 to about 23 wt %, of the α,β-ethylenically unsaturated carboxylic acid to provide enhanced adhesion, clarity, percent light transmission and physical properties, such as higher flexural moduli and stiffness.

The α-olefin used herein incorporates from 2 to 10 carbon atoms. The α-olefin may be selected from the group consisting of ethylene, propylene, 1-butene, 1-pentene, 1-hexene, 1-heptene, 3-methyl-1-butene, 4-methyl-1-pentene, and the like and mixtures thereof. Preferably, the α-olefin is ethylene. The α,β-ethylenically unsaturated carboxylic acid used herein may be selected from the group consisting of acrylic acids, methacrylic acids, itaconic acids, maleic acids, maleic anhydrides, fumaric acids, monomethyl maleic acids, and mixtures thereof. Preferably, the α,β-ethylenically unsaturated carboxylic acid is selected from the group consisting of acrylic acids, methacrylic acids and mixtures thereof.

The acid copolymer may further comprise polymerized residues of at least one other unsaturated comonomer. Specific examples of such other unsaturated comonomers include, but are not limited to, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol) acrylate, poly(ethylene glycol)methacrylate, poly(ethylene glycol)methyl ether acrylate, poly(ethylene glycol)methyl ether methacrylate, poly(ethylene glycol)behenyl ether acrylate, poly(ethylene glycol)behenyl ether methacrylate, poly(ethylene glycol) 4-nonylphenyl ether acrylate, poly(ethylene glycol) 4-nonylphenyl ether methacrylate, poly(ethylene glycol)phenyl ether acrylate, poly(ethylene glycol)phenyl ether methacrylate, dimethyl maleate, diethyl maleate, dibutyl maleate, dimethyl fumarate, diethyl fumarate, dibutyl fumarate, dimenthyl fumarate and the like and mixtures thereof. Preferably, the other unsaturated comonomers are selected from the group consisting of methyl acrylate, methyl methacrylate, butyl acrylate, butyl methacrylate, glycidyl methacrylate and mixtures thereof. The acid copolymers used herein may incorporate from 0 to about 50 wt % of polymerized residues of the other unsaturated comonomers, based on the total weight of the composition. Preferably, the acid copolymers used herein incorporate from 0 to about 30 wt %, or more preferably, from 0 to about 20 wt %, of polymerized residues of the other unsaturated comonomers. The acid copolymers used herein may be polymerized as disclosed, for example, in U.S. Pat. Nos. 3,404,134; 5,028,674; 6,500,888; and 6,518,365.

II. Ionomers:

The ionomers used herein are derived from certain of the above mentioned acid copolymers. The ionomers of the present invention may contain greater than or equal to about 10 wt % of polymerized residues of α,β-ethylenically unsaturated carboxylic acids based on the total weight of the parent acid copolymers. Preferably, the ionomers contain greater than or equal to about 15 wt %, or more preferably, greater than or equal to about 18 wt %, or most preferably, greater than or equal to about 20 wt %, or yet more preferably, from about 20 to about 25 wt % of polymerized residues of α,β-ethylenically unsaturated carboxylic acids to provide enhanced adhesion, clarity, percent light transmission and physical properties, such as higher flexural moduli and stiffness.

It is noted that the ionomer resins used herein provide the films or sheets derived therefrom with improved toughness relative to what would be expected of a shaped article comprising a higher acid content. It is believed that improved toughness in the present invention is obtained by preparing a parent acid copolymer base resin with a lower melt index (MI) before it is neutralized. The parent acid copolymer resin of the present invention preferably has a MI of less than 60 g/10 min, or more preferably, less than 55 g/10 min, or yet more preferably, less than 50 g/10 min, or yet more preferably, less than 35 g/10 min, as determined at 190° C. The MI can be measured by any standard test, such as test methods ISO 1133 and ASTM D1238, which are generally conducted at a temperature of 190° C. with a load of 2160 g.

To form the ionomers, the parent acid copolymers may be neutralized from about 10% to about 100% with metallic ions based on the total carboxylic acid content. Preferably, parent acid copolymers are from about 10% to about 50%, or more preferably, from about 20% to about 40% neutralized with metallic ions. The metallic ions may be monovalent, divalent, trivalent, multivalent, or mixtures of ions having the same or different valencies. Exemplary monovalent metallic ions include, but are not limited to, sodium, potassium, lithium, silver, mercury, copper, and the like and mixtures thereof. Exemplary divalent metallic ions include, but are not limited to, beryllium, magnesium, calcium, strontium, barium, copper, cadmium, mercury, tin, lead, iron, cobalt, nickel, zinc, and the like and mixtures thereof. Exemplary trivalent metallic ions include, but are not limited to, aluminum, scandium, iron, yttrium, and the like and mixtures thereof. Exemplary multivalent metallic ions include, but are not limited to, titanium, zirconium, hafnium, vanadium, tantalum, tungsten, chromium, cerium, iron, and the like and mixtures thereof. Notably, when the metallic ion is multivalent, complexing agents, such as stearate, oleate, salicylate, and phenolate radicals are included, as disclosed within U.S. Pat. No. 3,404,134. Preferably, the metallic ion may be selected from the group consisting of sodium, lithium, magnesium, zinc, aluminum, and mixtures thereof. More preferably, the metallic ion may be selected from the group consisting of sodium, zinc, and mixtures thereof. Most preferably, the metallic ion is zinc. The parent acid copolymers of the present invention may be neutralized as disclosed, for example, in U.S. Pat. No. 3,404,134.

The ionomers used herein preferably have a MI less than about 10 g/10 min, as measured by ASTM method D1238 at 190° C., to reduce resin creep (flow) during the lamination process and within the end-use. More preferably, the ionomers have a MI less than about 5 g/10 min, or most preferably, less than about 3 g/10 min. The ionomers also preferably have a flexural modulus greater than about 40,000 psi, as measured by ASTM method D638. More preferably, the ionomers have a flexural modulus greater than about 50,000 psi, and most preferably, greater than about 60,000 psi.

III. Ethylene Acrylate Ester Copolymers:

In accordance to the present invention, the ethylene acrylate ester copolymer is a copolymer comprising finite amounts of polymerized residues of an α-olefin and polymerized residues of an acrylate ester. Preferably, the α-olefin is ethylene.

Specific examples of preferable acrylate ester comonomers include, but are not limited to, methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol) acrylate, poly(ethylene glycol)methacrylate, poly(ethylene glycol)methyl ether acrylate, poly(ethylene glycol)methyl ether methacrylate, poly(ethylene glycol)behenyl ether acrylate, poly(ethylene glycol)behenyl ether methacrylate, poly (ethylene glycol) 4-nonylphenyl ether acrylate, poly(ethylene glycol) 4-nonylphenyl ether methacrylate, poly(ethylene glycol)phenyl ether acrylate, poly(ethylene glycol)phenyl ether methacrylate, dimethyl maleate, diethyl maleate, dibutyl maleate, dimethyl fumarate, diethyl fumarate, dibutyl fumarate, dimenthyl fumarate, and the like and combinations thereof. Specific examples of more preferable acrylate ester comonomers include methyl acrylate, ethyl acrylate, isopropyl acrylate, butyl acrylate and combinations thereof.

The ethylene acrylate ester copolymers used herein may comprise greater than or equal to about 1 wt % of polymerized residues of acrylate ester comonomers, based on the total weight of the composition. Preferably, the ethylene acrylate ester copolymers of the present invention comprise greater than or equal to about 15 wt %, or more preferably, greater than or equal to about 20 wt %, or yet more preferably, greater than or equal to about 25 wt %, or yet more preferably, greater than or equal to about 30 wt %, or yet more preferably, about 30 to about 40 wt %, of polymerized residues of acrylate ester comonomers to provide enhanced clarity, percent light transmission and physical properties, such as a reduced modulus and flexibility.

The ethylene acrylate ester copolymers used herein may have a tensile modulus equal to or less than about 10,000 psi to afford good physical shock protection for the solar cell. The tensile modulus may be measured through any know art method, for example, test methods ISO 527-2 (1 mm/min) and ASTM D638. Preferably, the ethylene acrylate ester copolymers of the present invention have a tensile modulus equal to or less than about 7,500 psi, or more preferably, equal to or less than about 5,000 psi, or most preferably, equal to or less than about 3,000.

The ethylene acrylate ester copolymers may have a MI of any value that is desired. Preferably the ethylene acrylate ester copolymers of the present invention have a MI less than about 60 g/10 min, or more preferably, less than about 30 g/10 min, or most preferably, less than about 15 g/10 min as determined at 190° C. In a particular embodiment of the present invention, whereby the ethylene acrylate ester copolymers are not cross-linked, the MI preferably may be less than about 5 g/10 min, or more preferably less than about 3 g/10 min, or most preferably less than about 2 g/10 min.

IV. Additives:

The polymeric compositions used in the thermoplastic bi-layer film or sheet 20 of the present invention, or each of the two surface layers 22 and 24, may further contain additives which effectively reduce the melt flow of the resin, to the limit of producing thermoset films or sheets. The use of such additives will enhance the upper end-use temperature and reduce creep of the encapsulant layer and laminates of the present invention, both during the lamination process and the end-uses thereof. Typically, the end-use temperature will be enhanced up to 20° C. to 70° C. In addition, laminates produced from such materials will be fire resistant. By reducing the melt flow of the thermoplastic bi-layer films or sheets 20 of the present invention, the material will have a reduced tendency to melt and flow out of the laminate and therefore less likely to serve as additional fire fuel. Specific examples of melt flow reducing additives include, but are not limited to, organic peroxides, such as 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy)hexane, dicumyl peroxide, alpha, alpha'-bis(tert-butyl-peroxyisopropyl)benzene, n-butyl-4,4-bis(tert-butylperoxy)valerate, 2,2-bis(tert-butylperoxy)butane, 1,1-bis(tert-butyl-peroxy)cyclohexane, 1,1-bis(tert-butylperoxy)-3,3,5-trimethyl-cyclohexane, tert-butyl peroxybenzoate, benzoyl peroxide, and the like and mixtures or combinations thereof. The organic peroxide may decompose at a temperature of about 100° C. or higher to generate radicals. Preferably, the organic peroxides have a decomposition temperature which affords a half life of 10 hours at about 70° C. or higher to provide improved stability for blending operations. Typically, the organic peroxides will be added at a level of between about 0.01 and about 10 wt % based on the total weight of composition. If desired, initiators, such as dibutyltin dilaurate, may be used. Typically, initiators are added at a level of from about 0.01 to about 0.05 wt % based on the total weight of composition. If desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 wt % based on the total weight of the composition. However, for the sake of process simplification and ease, it is preferred that the thermoplastic bi-layer film or sheet 20 of the present invention does not incorporate cross-linking additives, such as the abovementioned peroxides.

It is understood that the polymeric compositions used in the thermoplastic bi-layer film or sheet 20, or the surface layers 22 and 24, may further contain any additive known within the art. Such exemplary additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, dispersants, surfactants, chelating agents, coupling agents, adhesives, primers, reinforcement additives, such as glass fiber, fillers and the like.

Thermal stabilizers are well disclosed within the art. Any known thermal stabilizer will find utility within the present invention. General classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds which destroy peroxide, hydroxylamines, nitrones, thiosynergists, benzofuranones, indolinones, and the like and mixtures thereof. The polymeric compositions disclosed herein may comprise 0 to about 10.0 wt % of the thermal stabilizers, based on the total weight of the composition. Preferably, the polymeric compositions disclosed herein comprise 0 to about 5.0 wt %, or more preferably, 0 to about 1.0 wt % of the thermal stabilizers.

UV absorbers are well disclosed within the art. Any known UV absorber will find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The polymeric compositions disclosed herein may comprise 0 to about 10.0 wt % of the UV absorbers, based on the total weight of the composition. Preferably, the polymeric compositions disclosed herein comprise 0 to about 5.0 wt %, or more preferably, 0 to about 1.0 wt % of the UV absorbers.

Generally, hindered amine light stabilizers are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. Essentially any hindered amine light stabilizers known within the art may find utility within the present invention. The polymeric compositions disclosed herein may comprise 0 to about 10.0 wt % of hindered amine light stabilizers, based on the total weight of the composition. Preferably, the polymeric compositions disclosed herein comprise 0 to about 5.0 wt %, or more preferably, 0 to about 1.0 wt % of hindered amine light stabilizers.

Silane coupling agent may be added in the polymeric compositions to enhance the adhesive strengths. Specific examples of the silane coupling agents include, but are not limited to, gamma-chloropropylmethoxysilane, vinyltriethoxysilane, vinyltris(beta-methoxyethoxy)silane, gamma-methacryloxypropylmethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, N-beta-(aminoethyl)-gamma-aminopropyltrimethoxysilane, and the like and mixtures thereof. These silane coupling agent materials may be used at a level of about 5 wt % or less, or preferably, about 0.001 to about 5 wt %, based on the total weight of the resin composition.

V. Bi-layer Films or Sheets and Their Preparation:

The thickness of each of the sub-layers that make up the total bi-layer film or sheet of the present invention is not critical and may be independently varied depending on the particular application. Preferably, the first surface layer 22, i.e., the surface layer that is formed of an acid copolymer, an ionomer, or a combination thereof, is minimized in thickness. Typically, the ionomeric or acid copolymer first surface layer 22 has a thickness equal to or less than about 5 mils (0.13 mm), or preferably, equal to or less than about 3 mils (0.08 mm), or more preferably, equal to or less than about 2 mils (0.05 mm), or even more preferably, equal to or less than about 1 mil (0.03 mm) thick. It is preferred, however, that the total thickness of the bi-layer film and sheet 20 may range from about 1 mil (0.026 mm) to about 120 mils (3.00 mm), or more preferably, from about 1 mil to about 40 mils (1.02 mm), or yet more preferably, from about 1 mil to about 20 mils (0.51 mm). It is understood that those relatively thinner bi-layer films will find the best utility within flexible solar cell modules, while the relatively thicker bi-layer sheets will find best utility in rigid solar cell modules.

By incorporating the pre-formed thermoplastic bi-layer films or sheets 20 of the present invention, it provides many desirable benefits to the overall solar cell modules and the process to produce the solar cell modules. Specifically, the acid copolymer and/or ionomer surface layers provide excellent adhesion to the other solar cell laminate layers, especially to the rigid support layers, such as the glass layer, without the need for the incorporation of adhesion promoters and additives. The acid copolymer and/or ionomer surface layers further make the bi-layer films or sheets 20 tack-free and do not block when rolled or stacked in storage or when manipulated during the production of the solar cell modules. In addition, since the acid copolymers and ionomers tend to be rigid and have a high modulus, the incorporation of the ethylene acrylate ester copolymer surface layer substantially enhances the overall flexibility of the bi-layer film or sheet 20 and lowers the modulus of the bi-layer film or sheet 20 to provide adequate physical shock protection for the fragile solar cell components.

The thermoplastic bi-layer films or sheets 20 of the present invention may have smooth or roughened surfaces. Preferably, the bi-layer films or sheets 20 have roughened surfaces to facilitate the de-airing of the laminates during the lamination process. This can be effected by mechanically embossing or by melt fracture during extrusion the bi-layer film or sheet 20 followed by quenching so that the roughness is retained during handling.

In accordance to the present invention, the thermoplastic bi-layer film or sheet 20 disclosed herein, may be produced through any known process. This may include the use of preformed ethylene acrylate ester copolymer films or sheets and ionomer or acid copolymer films or sheets, laminates thereof, extrusion coated multilayer films or sheets, co-extrusion casting and blown film processes. Generally, the bi-layer films or sheets are produced through extrusion casting or blown film processes.

Solar Cell Pre-Laminate Assemblies

Solar cells are commonly available on an ever increasing variety as the technology evolves and is optimized. Within the present invention, a solar cell is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620. Examples of thin film solar cell modules are those that comprise cadmium telluride or CIGS, (Cu(In—Ga)(SeS)2), thin film cells.

The present invention further provides a solar cell pre-laminate assembly comprising a solar cell layer formed of one or a plurality solar cells and at least one encapsulant layer that is formed of the bi-layer film or sheet 20 disclosed herein.

In accordance to the present invention, besides the at least one encapsulant layer formed of the bi-layer film or sheet 20, the solar cell pre-laminate assembly may optionally further comprise other encapsulant layers. Such other encapsulant layers may be formed of any suitable films or sheets, which include, but are not limited to, films or sheets comprising poly(vinyl butyral), ionomers, ethylene vinyl acetate (EVA), acoustic. poly(vinyl acetal), polyurethane (PU), poly vinyl chloride (PVC), polyethylenes (e.g., linear low density metallocene-catalyzed polyethylenes), polyolefin block elastomers, ethylene acrylate ester copolymers (e.g., poly(ethylene-co-methyl acrylate) and poly(ethylene-co-butyl acrylate)), acid copolymers, silicone elastomers and epoxy resins.

The thickness of the individual encapsulant layers other than the bi-layer films or sheets 20 is not critical and may be independently varied depending on the particular application. Preferably, the thickness of each of these encapsulant layers may independently range from about 1 mil (0.026 mm) to about 120 mils (3.00 mm), or more preferably, from about 1 mil to about 40 mils (1.02 mm), or most preferably, from about 1 mil to about 20 mils (0.51 mm). In addition, all the encapsulant layer(s) comprised in the solar cell laminates, may have smooth or roughened surfaces. Preferably, however, the encapsulant layer(s) have roughened surfaces to facilitate the de-airing of the laminates through the laminate process.

In one particular embodiment, the solar cell pre-laminate assembly comprises one layer of the thermoplastic bi-layer film or sheet 20 disclosed herein, which is positioned to one side of the solar cell layer and serves as one of the encapsulant layers, or preferably, the bi-layer film or sheet 20 is positioned to the light-receiving side of the solar cell layer and serves as the front-sheet encapsulant layer.

In a further embodiment, the solar cell pre-laminate assembly disclosed herein comprises two layers of the bi-layer film or sheet 20, wherein each of the two bi-layer films or sheets 20 is laminated to each of the two sides of the solar cell layer and serves as either the front-sheet encapsulant layer or the back-sheet encapsulant layer.

In yet a further embodiment, the solar cell pre-laminate assembly disclosed herein may further comprise an incident layer and/or a backing layer serving as the outer layers of the assembly at the light-receiving side and the back side, respectively.

The outer layers of the solar cell pre-laminate assemblies, i.e., the incident layers and the backing layers, may be derived from any suitable sheets or films. Suitable sheets used herein may be glass or plastic sheets, such as, polycarbonate, acrylics, polyacrylate, cyclic polyolefins (e.g., ethylene norbornene polymers), metallocene-catalyzed polystyrene, polyamides, polyesters, fluoropolymers and the like and combinations thereof. In addition, metal sheets, such as aluminum, steel, galvanized steel, or ceramic plates may be utilized in forming the back-sheet.

The term "glass" is meant to include not only window glass, plate glass, silicate glass, sheet glass, low iron glass, tempered glass, tempered CeO-free glass, and float glass, but also includes colored glass, specialty glass which includes ingredients to control, e.g., solar heating, coated glass with, for example, sputtered metals, such as silver or indium tin oxide, for solar control purposes, E-glass, Toroglass, Solex® glass (a product of Solutia) and the like. Such specialty glasses are disclosed in, e.g., U.S. Pat. Nos. 4,615,989; 5,173,212; 5,264,286; 6,150,028; 6,340,646; 6,461,736; and 6,468,934. The type of glass to be selected for a particular laminate depends on the intended use. When glass is used as one or both of the outer layers, i.e., the incident layer and the backing layer, it is preferred that the first surface layer 22 of the bi-layer film or sheet 20, i.e., the surface layer that is formed of an acid copolymer, an ionomer, or a combination thereof, is adjacent and in direct contact with the glass layer(s).

Suitable film layers used herein may be polymeric. Preferred polymers used to form the polymeric films, include but are not limited to, poly(ethylene terephthalate) (PET), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymers and the like. Most preferably, the polymeric film is biaxially oriented PET film or a fluoropolymer film (e.g., Tedlar®, Tefzel®, and Teflon® films, from E. I. du Pont de Nemours and Company (DuPont)). Metal films, such as aluminum foil may also be used herein as the back-sheet.

The solar cell pre-laminate assembly of the present invention, may optionally further comprise other functional film or sheet layers (e.g., dielectric layers or barrier layers) embedded within the assembly. Such functional layers may be derived from any of the above mentioned polymeric films or those that are coated with additional functional coatings. For example, PET films coated with a metal oxide coating, such as those disclosed within U.S. Pat. Nos. 6,521,825 and 6,818,819 and European Patent No. EP 1 182 710, may function as oxygen and moisture barrier layers in the laminates.

If desired, a layer of non-woven glass fiber (scrim) may also be included in the solar cell laminates to facilitate de-airing during the lamination process or to serve as reinforcement for the encapsulant layer(s). The use of such scrim layers within solar cell laminates is disclosed within, e.g., U.S. Pat. Nos. 5,583,057; 6,075,202; 6,204,443; 6,320,115; 6,323,416; and European Patent No. 0 769 818.

In addition, it is understood that all the film or sheet layers positioned to the light-receiving side of the solar cell layer are made of transparent material to allow efficient transmission of sunlight into the solar cell(s). In some instances, a special film or sheet layer may be included to serve both the function of an encapsulant layer and an outer layer, e.g., an incident layer or a back-sheet. It is also conceivable that any of the film or sheet layers included in the assembly may be formed of single- or multi-layer films or sheets.

Figure 3:
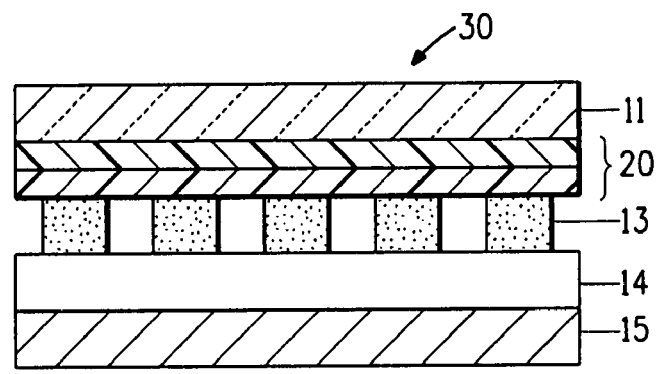
FIG. 3 is a cross-sectional view of one particular embodiment of the solar cell pre-laminate assembly of the present invention, which comprises, from top to bottom, an incident layer 11, a front-sheet encapsulant layer that is formed of the bi-layer film or sheet 20 (shown in FIG. 2), a solar cell layer 13, an optional back-sheet encapsulant layer 14, and a backing layer 15.

Shown in FIG. 3 is one particular embodiment of the solar cell pre-laminate assembly of the present invention. In this embodiment, the assembly 30 comprises (i) an incident layer 11 formed of glass, (ii) a front-sheet encapsulant layer that is formed of the bi-layer film or sheet 20 (shown in FIG. 2) and has its first surface layer 22 in direct contact with the glass incident layer), (iii) a solar cell layer 13 formed of a plurality of solar cells, (iv) a back-sheet encapsulant layer 14, and (v) a backing layer 15.

Figure 4:
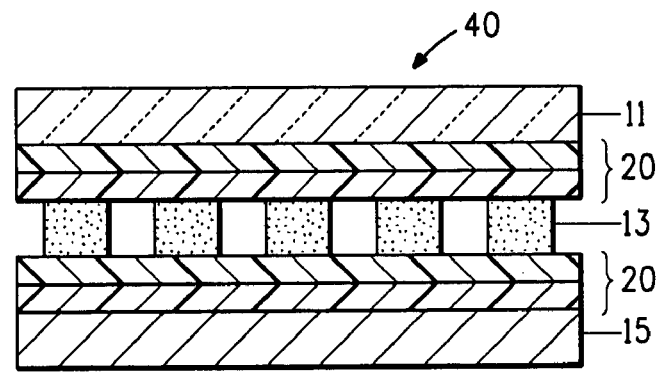
FIG. 4 is a cross-sectional view of another particular embodiment of the solar cell pre-laminate assembly of the present invention, which comprises, from top to bottom, an incident layer 11, a front-sheet encapsulant layer that is formed of a first layer of the bi-layer film or sheet 20 (shown in FIG. 2), a solar cell layer 13, an optional back-sheet encapsulant layer that is formed of a second layer of the bi-layer film or sheet 20 (shown in FIG. 2), and a backing layer 15.

Shown in FIG. 4 is another particular embodiment of the solar cell pre-laminate assembly, which comprises (i) an incident layer 11 formed of glass, (ii) a front-sheet encapsulant layer that is formed of a first layer of the bi-layer sheet 20 (shown in FIG. 2) and has its first surface layer 22 in direct contact with the glass incident layer), (iii) a solar cell layer 13 formed of a plurality of solar cells, (iv) a back-sheet encapsulant layer that is formed of a second layer of the bi-layer sheet 20 (shown in FIG. 2) and has its second surface layer 24 in direct contact with the solar cell layer), and (v) a backing layer 15 formed of glass.

Also in accordance to the present invention, if greater adhesion is desired, one or both surfaces of any of the composite layers within the assembly of the present invention may be treated to enhance the adhesion to other layers. This treatment may take any form known within the art, including adhesives, primers (e.g., silanes), flame treatments (see, e.g. U.S. Pat. Nos. 2,632,921; 2,648,097; 2,683,894; and 2,704,382), plasma treatments (see, e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of a polymeric film through vacuum sputtering as disclosed in U.S. Pat. No. 4,865,711. Or, as disclosed in U.S. Pat. No. 5,415,942, a hydroxy-acrylic hydrosol primer coating that may serve as an adhesion-promoting primer for PET films.

In a particular embodiment, the adhesive layer may take the form of a coating. The thickness of the adhesive/primer coating may be less than 1 mil, or preferably, less than 0.5 mil, or more preferably, less than 0.1 mil. The adhesive may be any adhesive or primer known within the art. Specific examples of adhesives and primers useful in the present invention include, but are not limited to, gamma-chloropropylmethoxysilane, vinyltrichlorosilane, vinyltriethoxysilane, vinyltris(beta-methoxyethoxy)silane, gamma-methacryloxypropyltrimethoxysilane, beta-(3,4-epoxycyclohexyl)ethyltrimethoxysilane, gammaglycidoxypropyltrimethoxysilane, vinyltriacetoxysilane, gamma-mercaptopropyltrimethoxysilane, gamma-aminopropyltriethoxysilane, N-beta-(aminoethyl)-gamma-aminopropyl-trimethoxysilane, glue, gelatine, caesin, starch, cellulose esters, aliphatic polyesters, poly(alkanoates), aliphatic-aromatic polyesters, sulfonated aliphatic-aromatic polyesters, polyamide esters, rosin/polycaprolactone triblock copolymers, rosin/poly(ethylene adipate) triblock copolymers, rosin/poly(ethylene succinate) triblock copolymers, poly(vinyl acetates), poly(ethylene-co-vinyl acetate), poly(ethylene-co-ethyl acrylate), poly(ethylene-co-methyl acrylate), poly(ethylene-co-propylene), poly(ethylene-co-1-butene), poly(ethylene-co-1-pentene), poly(styrene), acrylics, polyurethanes, sulfonated polyester urethane dispersions, nonsulfonated urethane dispersions, urethane-styrene polymer dispersions, non-ionic polyester urethane dispersions, acrylic dispersions, silanated anionic acrylate-styrene polymer dispersions, anionic acrylate-styrene dispersions, anionic acrylate-styrene-acrylonitrile dispersions, acrylate-acrylonitrile dispersions, vinyl chloride-ethylene emulsions, vinylpyrrolidone/styrene copolymer emulsions, carboxylated and noncarboxylated vinyl acetate ethylene dispersions, vinyl acetate homopolymer dispersions, polyvinyl chloride emulsions, polyvinylidene fluoride dispersions, ethylene acrylic acid dispersions, polyamide dispersions, anionic carboxylated or noncarboxylated acrylonitrile-butadiene-styrene emulsions and acrylonitrile emulsions, resin dispersions derived from styrene, resin dispersions derived from aliphatic and/or aromatic hydrocarbons, styrene-maleic anhydrides, and the like and mixtures thereof.

In another particular embodiment, the adhesive or primer is a silane that incorporates an amine function. Specific examples of such materials include, but are not limited to, gamma-aminopropyltriethoxysilane, N-beta-(aminoethyl)-gamma-aminopropyl-trimethoxysilane, and the like and mixtures thereof. Commercial examples of such materials include, e.g., A-1100® silane, (from the Silquest Company, formerly from the Union Carbide Company, believed to be gamma-aminopropyltrimethoxysilane) and Z6020® silane (from the Dow Corning Corp.).

The adhesives may be applied through melt processes or through solution, emulsion, dispersion, and other suitable coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, e.g., U.S. Pat. Nos. 5,078,313; 5,281,446; and 5,456,754.

Notably, specific solar cell pre-laminate assemblies (top (light incident) side to back side) include, but are not limited to, glass/the bi-layer film or sheet 20/solar cell/the bi-layer film or sheet 20/glass; glass/the bi-layer film or sheet 20/solar cell/the bi-layer film or sheet 20/Tedlar® film; Tedlar® film/the bi-layer film or sheet 20/solar cell/the bi-layer film or sheet 20/glass; Tedlar® film/the bi-layer film or sheet 20/solar cell/the bi-layer film or sheet 20/Tedlar® film; glass/the bi-layer film or sheet 20/solar cell/the bi-layer film or sheet 20/PET film; Tedlar® film/the bi-layer film or sheet 20/solar cell/the bi-layer film or sheet 20/PET film; glass/the bi-layer film or sheet 20/solar cell/the bi-layer film or sheet 20/barrier coated film/the bi-layer film or sheet 20/glass; glass/ionomer encapsulant layer/solar cell/the bi-layer film or sheet 20/barrier coated film/the bi-layer film or sheet 20/Tedlar® film; Tedlar® film/the bi-layer film or sheet 20/barrier coated film/the bi-layer film or sheet 20/solar cell/the bi-layer film or sheet 20/barrier coated film/the bi-layer film or sheet 20/Tedlar® film; glass/the bi-layer film or sheet 20/solar cell/the bi-layer film or sheet 20/aluminum stock; Tedlar® film/the bi-layer film or sheet 20/solar cell/the bi-layer film or sheet 20/aluminum stock; glass/the bi-layer film or sheet 20/solar cell/the bi-layer film or sheet 20/galvanized steel sheet; glass/the bi-layer film or sheet 20/solar cell/the bi-layer film or sheet 20/PET film/the bi-layer film or sheet 20/aluminum stock; Tedlar® film/the bi-layer film or sheet 20/solar cell/the bi-layer film or sheet 20/PET film/the bi-layer film or sheet 20/aluminum stock; glass/the bi-layer film or sheet 20/solar cell/the bi-layer film or sheet 20/PET film/the bi-layer film or sheet 20/galvanized steel sheet; Tedlar®/the bi-layer film or sheet 20/solar cell/the bi-layer film or sheet 20/PET film/the bi-layer film or sheet 20/galvanized steel sheet; glass/the bi-layer film or sheet 20/solar cell/acoustic poly(vinyl butyral) encapsulant layer/glass; glass/the bi-layer film or sheet 20/solar cell/poly(vinyl butyral) encapsulant layer/Tedlar® film; Tedlar® film/ionomer encapsulant layer/solar cell/the bi-layer film or sheet 20/glass; Tedlar® film/the bi-layer film or sheet 20/solar cell/acid copolymer encapsulant layer/Tedlar® film; glass/the bi-layer film or sheet 20/solar cell/ethylene vinyl acetate encapsulant layer/PET film; Tedlar® film/the bi-layer film or sheet 20/solar cell/poly(ethylene-co-methyl acrylate) encapsulant layer/PET film; glass/poly(ethylene-co-butyl acrylate) encapsulant layer/solar cell/the bi-layer film or sheet 20/barrier coated film/poly(ethylene-co-butyl acrylate) encapsulant layer/glass; glass/the bi-layer film or sheet 20/solar cell/the bi-layer film or sheet 20/"Tedlar®/polyester/Tedlar®" tri-layer film; Tedlar® film/the bi-layer film or sheet 20/solar cell/the bi-layer film or sheet 20/"Tedlar®/polyester/Tedlar®" tri-layer film; glass/the bi-layer film or sheet 20/the bi-layer film or sheet 20/"Tedlar®/polyester/EVA" tri-layer film; Tedlar® film/the bi-layer film or sheet 20/solar cell/the bi-layer film or sheet 20/"Tedlar®/polyester/EVA" tri-layer film; and the like.

Manufacture of Solar Cell Modules

The present invention further provides a simplified process for manufacturing solar cell modules which involves subjecting the above disclosed solar cell pre-laminate assemblies to a further lamination process.

In accordance to the present invention, the lamination process may be an autoclave or non-autoclave process. For example, the solar cell pre-laminate assembly described above may be laid up in a vacuum lamination press and laminated together under vacuum with heat and standard atmospheric or elevated pressure In an exemplary process, a glass sheet, a front-sheet encapsulant layer, a solar cell, a back-sheet encapsulant layer and Tedlar® film, and a cover glass sheet are laid up and laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the pre-laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of about 200 psi (about 15 bars), for from about 10 to about 50 minutes. Preferably the bag is autoclaved at a temperature of from about 120° C. to about 160° C. for about 20 to about 45 minutes. More preferably the bag is autoclaved at a temperature of from about 135° C. to about 160° C. for about 20 to about 40 minutes. A vacuum ring may be substituted for the vacuum bag. One type of vacuum bags is disclosed within U.S. Pat. No. 3,311,517.

Any air trapped within the pre-laminate assembly may be removed through a nip roll process. For example, the pre-laminate assembly may be heated in an oven at a temperature of about 80° C. to about 120° C., or preferably, at a temperature of between about 90° C. and about 100° C., for about 30 minutes. Thereafter, the heated pre-laminate assembly is passed through a set of nip rolls so that the air in the void spaces between the solar cell outside layers, the solar cell(s) and the encapsulant layers may be squeezed out, and the edge of the assembly sealed. This process may provide the final solar cell module or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and pressure to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the solar cell laminates are removed from the autoclave. This should not be considered limiting. Essentially any lamination process known within the art may be used herein.

A non-autoclave lamination process has been disclosed, e.g., within U.S. Pat. Nos. 3,234,062; 3,852,136; 4,341,576; 4,385,951; 4,398,979; 5,536,347; 5,853,516; 6,342,116; and 5,415,909, US Patent Application No. 2004/0182493, European Patent No. EP 1 235 683 B1, and PCT Patent Application Nos. WO 91/01880 and WO 03/057478 A1. Generally, the non-autoclave process includes heating the pre-laminate assembly or the pre-press assembly and the application of vacuum, pressure or both. For example, the pre-press may be successively passed through heating ovens and nip rolls.

If desired, the edges of the solar cell module or laminate may be sealed to reduce moisture and air intrusion and the potential degradation effect on the efficiency and lifetime of the solar cell(s) by any means disclosed within the art. Suitable edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples are intended to be illustrative of the present invention, and are not intended in any way to limit the scope of the present invention. The solar cell interconnections are omitted from the examples below to clarify the structures, but any common art solar cell interconnections may be utilized within the present invention.

Methods

The following methods are used in the Examples presented hereafter.

I. Embossed Sheet Structure:

Embossed sheet structures are prepared on a 24 inch width Sano multilayer co-extrusion line equipped with embossing rolls utilizing common art sheet formation processes. This essentially entails the use of an extrusion line consisting of a twin-screw extruder with a sheet die feeding melt into a calendar roll stack. The calendar rolls have an embossed surface pattern engraved into the metal surface which imparts to varying degrees a reverse image of the surface texture onto the polymer melt as it passes between and around the textured rolls. Both surfaces of the sheet are embossed with a pattern having the following characteristics:

| Mound average depth: | 21 ± 4 micron |
| Mound peak depth: | 25 ± 5 micron |
| Pattern frequency/mm: | 2 |
| Mound width: | 0.350 ± 0.02 mm |
| Valley width: | 0.140 ± 0.02 mm |

Surface roughness, Rz, can be expressed in microns by a 10-point average roughness in accordance with ISO-R468 of the International Organization for Standardization. Roughness measurements are made using a stylus-type profilometer (Surfcom 1500A manufactured by Tokyo Seimitsu Kabushiki Kaisha of Tokyo, Japan) as described in ASME B46.1-1995 using a trace length of 26 mm. ARp and ARt, and the area kurtosis are measured by tracing the roughness over a 5.6 mm×5.6 mm area in 201 steps using the Perthometer Concept system manufactured by Mahr GmbH, Gottingen, Germany. The sheet therefore formed typically has an Rz in the range of from about 15 to about 25 micron.

II. Laminate Structure:

The laminate structures described in the following examples are produced in the following manner. Each layer making up a particular laminate structure is stacked (laid up) to form a pre-laminate structure. The pre-laminate structure is then placed within a vacuum bag, which was sealed and placed into an oven at room temperature (25° C.±5° C.). A vacuum is then applied to remove the air from the vacuum bag. While maintaining the application of the vacuum to the vacuum bag, the vacuum bag is heated at 135° C. for 30 minutes. The vacuum is then discontinued and the vacuum bag removed from the oven and allowed to cool to room temperature (25° C.±5° C.). At this point, the laminate structure is formed and removed from the vacuum bag.

Examples 1-11

Examples 1-5 are a series of bi-layer film structures prepared through a blown film process, as is commonly known within the art. The composition of the bi-layer film structures are listed in Table 1. Based on these structures, a series of laminate structures (Examples 6-11, listed in

TABLE 1

Bi-layer Film Structures

| Example | Layer 1 (Thickness) | Layer 2 (Thickness) |
|---|---|---|
| 1 | Ionomer 1 (0.5 mils, (0.013 mm)) | EBA 1 (2 mils, (0.05 mm)) |
| 2 | Ionomer 2 (1 mil, (0.03 mm)) | EEA (3 mils, (0.08 mm)) |
| 3 | Ionomer 3 (0.7 mils, (0.018 mm)) | EMA 1 (2 mils, (0.05 mm)) |
| 4 | ACR 1 (0.5 mils, (0.013 mm)) | EBA2 (2 mils, (0.05 mm)) |
| 5 | ACR 2 (1 mil, (0.03 mm)) | EMA 2 (3 mils, (0.08 mm)) |

ACR 1 is a poly(ethylene-co-methacrylic acid) containing 12 wt % of polymerized residues of methacrylic acid and having a MI of 1 g/10 minutes (190° C., ISO 1133, ASTM D1238).
ACR 2 is a poly(ethylene-co-methacrylic acid) containing 19 wt % of polymerized residues of methacrylic acid and having a MI of 2 g/10 minutes (190° C., ISO 1133, ASTM D1238).
EBA 1 is a poly(ethylene-co-n-butyl acrylate) containing 27 wt % of polymerized residues of n-butyl acrylate and having a MI of 4 g/10 minutes (190° C., ISO 1133, ASTM D1238).
EBA 2 is a poly(ethylene-co-n-butyl acrylate) containing 30 wt % of polymerized residues of n-butyl acrylate and having a MI of 1 g/10 minutes (190° C., ISO 1133, ASTM D1238).
EEA is a poly(ethylene-co-ethyl acrylate) containing 32 wt % of polymerized residues of ethyl acrylate and having a MI of 0.4 g/10 minutes (190° C., ISO 1133, ASTM D1238).
EMA 1 is a poly(ethylene-co-methyl acrylate containing 30 wt % of polymerized residues of methyl acrylate.
EMA 2 is a poly(ethylene-co-methyl acrylate) containing 35 wt % of polymerized residues of methyl acrylate and having a MI of 0.7 g/10 minutes (190° C., ISO 1133, ASTM D1238).
Ionomer 1 is a poly(ethylene-co-methacrylic acid) containing 15 wt % of polymerized residues of methacrylic acid that is 21% neutralized with zinc ion and having a MI of 5 g/10 minutes (190° C., ISO 1133, ASTM D1238). Ionomer 1 is prepared from a comparable acid copolymer having a MI of 25 g/10 minutes.
Ionomer 2 is a poly(ethylene-co-methacrylic acid) containing 19 wt % of polymerized residues of methacrylic acid that is 36% neutralized with zinc ion and having a MI of 1 g/10 minutes (190° C., ISO 1133, ASTM D1238). Ionomer 2 is prepared from a comparable acid copolymer having a MI of 60 g/10 minutes.
Ionomer 3 is a poly(ethylene-co-methacrylic acid) containing 21 wt % of polymerized residues fo methacrylic acid that is 30% neutralized with zinc ion and having a MI of 1 g/10 minutes (190° C., ISO 1133, ASTM D1238). Ionomer 3 is prepared from a comparable acid copolymer having an MI of 45 g/10 minutes.

TABLE 2

Solar Cell Laminate Structures

| Example | Layer 1 | Layer 2 | Layer 3 | Layer 4 | Layer 5 |
|---|---|---|---|---|---|
| 6 | FPF | Example 1 | Solar Cell 1 | Example 1 | FPF |
| 7 | FPF | Example 2 | Solar Cell 2 | Example 2 | ALF |
| 8 | FPF | Example 3 | Solar Cell 3 | Example 3 | FPF |
| 9 | FPF | Example 3 | Solar Cell 4 | Example 1 | FPF |

TABLE 2-continued

Solar Cell Laminate Structures

| Example | Layer 1 | Layer 2 | Layer 3 | Layer 4 | Layer 5 |
|---|---|---|---|---|---|
| 10 | FPF | Example 4 | Solar Cell 1 | Example 4 | FPF |
| 11 | FPF | Example 5 | Solar Cell 4 | Example 5 | ALF |

ALF is an aluminum sheet (3.2 mm thick) and is 5052 alloyed with 2.5 wt % of magnesium and conforms to Federal specification QQ-A-250/8 and ASTM B209.
FPF is a corona surface treated Tedlar ® film grade WH15BL3 (1.5 mil (0.038 mm) thick), a product of DuPont.
Solar Cell 1 is a 10-inch by 10-inch amorphous silicon photovoltaic device comprising a stainless steel substrate (125 μm thick) with an amorphous silicon semiconductor layer (U.S. Pat. No. 6,093,581, Example 1).
Solar Cell 2 is a 10-inch by 10-inch copper indium diselenide (CIS) photovoltaic device (U.S. Pat. No. 6,353,042, column 6, line 19).
Solar Cell 3 is a 10-inch by 10-inch cadmium telluride (CdTe) photovoltaic device (U.S. Pat. No. 6,353,042, column 6, line 49).
Solar Cell 4 is a silicon solar cell made from a 10-inch by 10-inch polycrystallin EFG-grown wafer (U.S. Pat. No. 6,660,930, column 7, line 61).

Examples 12-49

Examples 12-17 are a series of embossed bi-layer sheet structures, with their compositions listed in Table 3.

TABLE 3

Bi-layer Sheet Structures

| Example | Layer 1 (Thickness) | Layer 2 (Thickness) |
|---|---|---|
| 12 | Ionomer 1 (0.5 mils, (0.013 mm)) | EBA 1 (19 mils, (0.48 mm)) |
| 13 | Ionomer 3 (1 mil, (0.03 mm)) | EEA (18 mils, (0.4 mm)) |
| 14 | Ionomer 4 (0.7 mils, (0.018 mm) | EMA 1 (13 mils, (0.33 mm)) |
| 15 | Ionomer 5 (1 mil, (0.03 mm)) | EBA 2 (18 mils, (0.4 mm)) |
| 16 | ACR 1 (0.5 mils, (0.013 mm)) | EBA 3 (19 mils, (0.48 mm)) |
| 17 | ACR 2 (1 mil, (0.03 mm)) | EMA 2 (18 mils, (0.4 mm)) |

EBA 3 is a compounded composition consisting of 99.8 wt % of EBA 1 and 0.2 wt % of 3-aminopropyltrimethoxysilane.
Ionomer 4 is a poly(ethylene-co-methacrylic acid) containing 19 wt % of polymerized residues of methacrylic acid that is 37% neutralized with sodium ion and having a MI of 2 g/10 minutes (190° C., ISO 1133, ASTM D1238). Ionomer 4 is prepared from the comparable acid copolymer having a MI of 60 g/10 minutes.
Ionomer 5 is a poly(ethylene-co-methacrylic acid) with 19 wt % of polymerized residues of methacrylic acid that is 39% neutralized with zinc ion and having a MI of 4 g/10 minutes (190° C., ISO 1133, ASTM D1238). Ionomer 5 is prepared from the comparable acid copolymer having a MI of 25 g/10 minutes.

Examples 18-33, are a series of 12 inch×12 inch solar cell laminate structures, compositions of which are listed below in Table 4.

Also listed in Table 4 are Examples 34-49, which are a series of 12 inch×12 inch solar cell laminate structures similar to those of Examples 18-33, except that each of the laminate structures of Examples 34-49 includes a flexible film as a surface layer. In the preparation of these solar cell laminates, a 3 mm thick glass cover sheet is added to the laminate structure and then removed after the lamination process.

For all of the examples listed in Table 4, if the solar cell laminate structure includes a layer of glass, the first surface layer of the bi-layer sheet, which is formed of acid copolymers and/or ionomers, is placed in contact with the glass surface, and the second surface layer of the bi-layer sheet, which is formed of ethylene acrylate ester copolymers, is placed in contact with the solar cell surface.

TABLE 4

Solar Cell Laminate Structures

| Example | Layer 1 | Layer 2 | Layer 3 | Layer 4 | Layer 5 |
|---|---|---|---|---|---|
| 18, 34 | Glass 1 | Example 12 | Solar Cell 1 | Example 12 | Glass 1 |
| 19, 35 | Glass 2 | Example 13 | Solar Cell 2 | Example 13 | Glass 2 |
| 20, 36 | Glass 1 | Example 14 | Solar Cell 3 | Example 14 | Glass 2 |
| 21, 37 | Glass 1 | Example 15 | Solar Cell 4 | Example 15 | Glass 2 |
| 22, 38 | Glass 1 | Example 16 | Solar Cell 1 | Example 16 | ALF |
| 23, 39 | Glass 2 | Example 17 | Solar Cell 2 | EBA 4 | ALF |
| 24, 40 | Glass 2 | Example 12 | Solar Cell 3 | EMA 3 | ALF |
| 25, 41 | Glass 1 | Example 13 | Solar Cell 4 | EVA | ALF |
| 26, 42 | FPF | Example 14 | Solar Cell 1 | PVB | ALF |
| 27, 43 | FPF | Example 15 | Solar Cell 2 | Example 16 | ALF |
| 28, 44 | Glass 1 | Ionomer 7 | Solar Cell 1 | Example 17 | Glass 3 |
| 29, 45 | Glass 1 | Example 12 | Solar Cell 4 | Ionomer 6 | Glass 2 |
| 30, 46 | Glass 1 | Example 13 | Solar Cell 1 | ACR 3 | Glass 2 |
| 31, 47 | Glass 2 | Example 14 | Solar Cell 4 | PVB A | Glass 2 |
| 32, 48 | FPF | Example 15 | Solar Cell 1 | PVB S | Glass 2 |
| 33, 49 | Glass 1 | Example 13 | Solar Cell 1 | Example 17 | Glass 3 |

ACR 3 is a 20 mil (0.51 mm) thick embossed sheet of a poly(ethylene-co-methacrylic acid) containing 15 wt % of polymerized residues of methacrylic acid and having a MI of 5.0 g/10 minutes (190° C., ISO 1133, ASTM D1238).
EBA 4 is a formulated composition based on poly(ethylene-co-butyl acrylate) containing 20 wt % of polymerized residues of butyl acrylate based on the weight of the total copolymer in the form of a 20 mil (0.51 mm) thick sheet.
EMA 3 is a formulated composition based on poly(ethylene-co-methyl acrylate) containing 20 wt % of polymerized residues of methyl acrylate based on the weight of the total copolymer in the form of a 20 mil (0.51 mm) thick sheet.
EVA is SC50B, believed to be a formulated composition based on poly(ethylene-co-vinyl acetate) in the form of a 20 mil (0.51 mm) thick sheet, (a product of the Hi-Sheet Corporation, formerly Mitsui Chemicals Fabro, Inc.).
Glass 1 is a Starphire ® glass (3.2 mm thick) from the PPG Corporation.
Glass 2 is a clear annealed float glass plate layer (2.5 mm thick).
Glass 3 is a Solex ® solar control glass (3.0 mm thick).
Ionomer 6 is a 90 mil (2.25 mm) thick embossed sheet of a poly(ethylene-co-methacrylic acid) containing 18 wt % of polymerized residues of methacrylic acid that is 30% neutralized with zinc ion and having a MI of 1 g/10 minutes (190° C., ISO 1133, ASTM D1238). Ionomer 6 is prepared from a poly(ethylene-co-methacrylic acid) having an MI of 60 g/10 minutes.
Ionomer 7 is a 20 mil (0.51 mm) thick embossed sheet of a poly(ethylene-co-methacrylic acid) containing 22 wt % of polymerized residues of methacrylic acid that is 26% neutralized with zinc ion and having a MI of 0.75 g/10 minutes (190° C., ISO 1133, ASTM D1238). Ionomer 7 is prepared from a poly(ethylene-co-methacrylic acid) having an MI of 60 g/10 minutes.
PVB is B51V, believed to be a formulated composition based on poly(vinyl butyral) in the form of 20 mil (0.51 mm) thick sheet (a product of DuPont).
PVB A is an acoustic poly(vinyl butyral) sheet including 100 parts per hundred (pph) poly(vinyl butyral) with a hydroxyl number of 15 plasticized with 48.5 pph plasticizer tetraethylene glycol diheptanoate prepared similarly to that is disclosed in PCT Patent Application No. WO 2004/039581.
PVB S is a 20 mil (0.51 mm) thick stiff poly(vinyl butyral) sheet prepared similarly to that is disclosed in PCT Patent Application No. WO 03/078160, Example 2.

What is claimed is:

1. A solar cell pre-laminate assembly comprising: (i) a front-sheet encapsulant layer, (ii) a solar cell layer comprising one or a plurality of electronically interconnected solar cells and having a light-receiving side and a rear side, and (iii) an optional back-sheet encapsulant layer, wherein said front-sheet encapsulant layer and said optional back-sheet encapsulant layer are laminated to the light-receiving side and the rear side of said solar cell layer, respectively, and at least one of the two encapsulant layers is a bi-layer thermoplastic film or sheet comprising a first surface layer that comprises an acid copolymer, an ionomer, or a combination thereof and a second surface layer that comprises an ethylene acrylate ester copolymer;
wherein said acid copolymer comprises a finite amount of polymerized residues of an α-olefin and greater than or equal to 1 wt % of polymerized residues of an α, β-ethylenically unsaturated carboxylic acid, based on a total weight of said acid copolymer;
wherein said ionomer is a derivative of a parent acid copolymer comprising a finite amount of polymerized residues of an α-olefin and greater than or equal to about 10 wt % of polymerized residues of an α, β-ethylenically unsaturated carboxylic acid, based on a total weight of said parent acid copolymer and having about 10 to 100% of a total carboxylic acid content neutralized with metallic ions; and
wherein said ethylene acrylate ester copolymer comprises a finite amount of polymerized residues of an α-olefin and greater than or equal to 1 wt % of polymerized residues of an acrylate ester, based on a total weight of said ethylene acrylate ester copolymer.

2. The solar cell pre-laminate assembly of claim 1, wherein said front-sheet encapsulant layer is formed of the bi-layer thermoplastic film or sheet, and optional back-sheet encapsulant layer comprises a polymeric composition selected from the group consisting of poly(vinyl butyral), ionomers, ethylene vinyl acetate, acoustic poly(vinyl acetal), polyurethane, polyvinylchloride, polyethylenes, polyolefin block elastomers, ethylene acrylate ester copolymers, acid copolymers, silicone elastomers and epoxy resins.

3. The solar cell pre-laminate assembly of claim 2, wherein said back-sheet encapsulant layer is formed of a second layer of the bi-layer thermoplastic film or sheet.

4. The solar cell pre-laminate assembly of claim 1, wherein said one or a plurality of solar cells are selected from the group consisting of multi-crystalline solar cells, thin film solar cells, compound semiconductor solar cells, and amorphous silicon solar cells.

5. The solar cell pre-laminate assembly of claim 1, further comprising an incident layer that is formed of a transparent material and serves as an outer layer at the light-receiving side of the assembly.

6. The solar cell pre-laminate assembly of claim 1, further comprising a backing layer that serves as an outer layer at the back side of the assembly.

7. A solar cell pre-laminate assembly consisting essentially of, from top to bottom: (i) an incident layer made of transparent material, which is positioned adjacent to, (ii) a front-sheet encapsulant layer that is positioned adjacent to, (iii) a solar cell layer comprising one or a plurality of electronically interconnected solar cells, which is positioned adjacent to, (iv) a back-sheet encapsulant layer that is positioned adjacent to, (v) a backing layer, wherein at least one of the two encapsulant layers is a bi-layer-thermoplastic film or sheet comprising a first surface layer that comprises an acid copolymer, an ionomer, or a-combination thereof and a second surface layer that comprises an ethylene acrylate ester copolymer;
wherein said acid copolymer comprises a finite amount of polymerized residues of an α-olefin and greater than or equal to 1 wt % of polymerized residues of an α, β-ethylenically unsaturated carboxylic acid, based on a total weight of said acid copolymer;
wherein said ionomer is a derivative of a parent acid copolymer comprising a finite amount of polymerized residues of an α-olefin and greater than or equal to about 10 wt % of polymerized residues of an α, β-ethylenically unsaturated carboxylic acid, based on a total weight of said parent acid copolymer and having about 10 to 100% of a total carboxylic acid content neutralized with metallic ions; and
wherein said ethylene acrylate ester copolymer comprises a finite amount of polymerized residues of an α-olefin and greater than or equal to 1 wt % of polymerized residues of an acrylate ester, based on a total weight of said ethylene acrylate ester copolymer.

8. The solar cell pre-laminate assembly of claim 7, wherein said incident layer is formed of glass and said front-sheet encapsulant layer is formed of said one layer of the thermoplastic film or sheet with the first surface layer adjacent and in direct contact with said glass incident layer.

9. The solar cell pre-laminate assembly of claim 8, wherein said backing layer is also formed of glass and said back-sheet encapsulant layer is formed of a second layer of the thermoplastic film or sheet with the first surface layer adjacent and in direct contact with said glass backing layer.

10. A process of manufacturing a solar cell module comprising: (i) providing a solar cell pre-laminate assembly as described in claim 1 and (ii) laminating the assembly to form the solar cell module.

11. A process of manufacturing a solar cell module comprising: (i) providing a solar cell pre-laminate assembly as described in claim 8 and (ii) laminating the assembly to form the solar cell module, (a) wherein said first surface layer consists essentially of said ionomer or said acid copolymer, (b) wherein said ionomer consists essentially of an acid copolymer of polymerized residues of (i) ethylene, (ii) about 10 wt % to about 23 wt % of α, β-ethylenically unsaturated carboxylic acid selected from the group consisting of acrylic acids, methacrylic acids and mixtures thereof, and (iii) 0 to about 50 wt % of at least one other unsaturated comonomer selected from the group consisting of methyl acrylate, methyl methacrylate, butyl acrylate, butyl methacrylate, glycidyl methacrylate and mixtures thereof, which has been neutralized from about 10% to about 100% (based on the total carboxylic acid content) with metallic ions selected from the group consisting of sodium, lithium, magnesium, zinc, aluminum, and mixtures thereof; (c) wherein said acid copolymer consists essentially of polymerized residues of (i) ethylene, (ii) about 10 wt % to about 23 wt % of α, β-ethylenically unsaturated carboxylic acid selected from the group consisting of acrylic acids, methacrylic acids and mixtures thereof, and (iii) 0 to about 50 wt % of at least one other unsaturated comonomer selected from the group consisting of methyl acrylate, methyl methacrylate, butyl acrylate, butyl methacrylate, glycidyl methacrylate and mixtures thereof; (d) wherein said second surface layer consists essentially of said ethylene acrylate ester copolymer; and (e) said ethylene acrylate ester copolymer is a copolymer consists essentially of polymerized residues of ethylene and about 15 wt % to about 40 wt % of polymerized residues of an acrylate ester selected from the group consisting of methyl acrylate, ethyl acrylate, isopropyl acrylate, butyl acrylate and combinations thereof.

12. The process of claim 10, wherein the step (ii) of lamination is conducted by subjecting the assembly to heat.

13. The process of claim 12, wherein the step (ii) of lamination further comprises subjecting the assembly to pressure.

14. The process of claim 12, wherein the step (ii) of lamination further comprises subjecting the assembly to vacuum.

15. A solar cell module, which is prepared by the process of claim 10.

16. A solar cell module, which is prepared by the process of claim 11.

17. The solar cell pre-laminate assembly of claim 1, (a) wherein said first surface layer consists essentially of an ionomer, (b) wherein said ionomer consists essentially of an acid copolymer of polymerized residues of (i) ethylene, (ii) 10 wt % to 23 wt % of α, β-ethylenically unsaturated carboxylic acid selected from the group consisting of acrylic acids, methacrylic acids and mixtures thereof, and (iii) 0 to 50 wt % of at least one other unsaturated comonomer selected from the group consisting of methyl acrylate, methyl methacrylate, butyl acrylate, butyl methacrylate, glycidyl methacrylate and mixtures thereof, which has been neutralized from 10% to 100% (based on the total carboxylic acid content) with metallic ions selected from the group consisting of sodium, lithium, magnesium, zinc, aluminum, and mixtures thereof; (c) wherein said second surface layer consists essentially of said ethylene acrylate ester copolymer; and (d) said ethylene acrylate ester copolymer is a copolymer consists essentially of polymerized residues of ethylene and about 15 wt % to about 40 wt % of polymerized residues of an acrylate ester selected from the group consisting of methyl acrylate, ethyl acrylate, isopropyl acrylate, butyl acrylate and combinations thereof.

18. The solar cell pre-laminate assembly of claim 1, (a) wherein said first surface layer consists essentially of an acid copolymer; (b) wherein said acid copolymer consists essentially of polymerized residues of (i) ethylene, (ii) 10 wt % to 23 wt % of α, β-ethylenically unsaturated carboxylic acid selected from the group consisting of acrylic acids, methacrylic acids and mixtures thereof, and (iii) 0 to 50 wt % of at least one other unsaturated comonomer selected from the group consisting of methyl acrylate, methyl methacrylate, butyl acrylate, butyl methacrylate, glycidyl methacrylate and mixtures thereof; (c) wherein said second surface layer consists essentially of said ethylene acrylate ester copolymer; and (d) said ethylene acrylate ester copolymer is a copolymer consists essentially of polymerized residues of ethylene and 15 wt % to 40 wt % of polymerized residues of an acrylate ester selected from the group consisting of methyl acrylate, ethyl acrylate, isopropyl acrylate, butyl acrylate and combinations thereof.

19. The solar cell pre-laminate assembly of claim 1, wherein, in said first surface layer, said amount of α, β-ethylenically unsaturated carboxylic acid is 18 wt % to 23 wt %, and said amount of the at least one other unsaturated comonomer is 0 to 20 wt % which has been neutralized from about 20% to 40%; and wherein, in said second surface layer, said ethylene acrylate ester copolymer is a copolymer consisting essentially of polymerized residues of ethylene and about 30 wt % to about 40 wt % of polymerized residues of an acrylate ester.

20. The solar cell pre-laminate assembly of claim 1, wherein, in said first surface layer, said amount of α, β-ethylenically unsaturated carboxylic acid is 18 wt % to 23 wt %, and said amount of the at least one other unsaturated comonomer is 0 to 20 wt %; and wherein, in said second surface layer, said ethylene acrylate ester copolymer is a copolymer consisting essentially of polymerized residues of ethylene and about 30 wt % to about 40 wt % of polymerized residues of an acrylate ester.

21. The process of claim 11, wherein said first surface layer consists essentially of said ionomer or said acid copolymer, (a) wherein said first surface layer consists essentially of said ionomer or said acid copolymer, (b) wherein said ionomer consists essentially of an acid copolymer of polymerized residues of (i) ethylene, (ii) about 18 wt % to about 23 wt % of α, β-ethylenically unsaturated carboxylic acid selected from the group consisting of acrylic acids, methacrylic acids and mixtures thereof, and (iii) 0 to about 20 wt % of at least one other unsaturated comonomer selected from the group consisting of methyl acrylate, methyl methacrylate, butyl acrylate, butyl methacrylate, glycidyl methacrylate and mixtures thereof, which has been neutralized from about 20% to 40% (based on the total carboxylic acid content) with metallic ions selected from the group consisting of sodium, lithium, magnesium, zinc, aluminum, and mixtures thereof; (c) wherein said acid copolymer consists essentially of polymerized residues of (i) ethylene, (ii) about 18 wt % to about 23 wt % of α, β-ethylenically unsaturated carboxylic acid selected from the group consisting of acrylic acids, methacrylic acids and mixtures thereof, and (iii) 0 to about 20 wt % of at least one other unsaturated comonomer selected from the group consisting of methyl acrylate, methyl methacrylate, butyl acrylate, butyl methacrylate, glycidyl methacrylate and mixtures thereof; (d) wherein said second surface layer consists essentially of said ethylene acrylate ester copolymer; and (e) said ethylene acrylate ester copolymer is a copolymer consists essentially of polymerized residues of ethylene and about 30 wt % to about 40 wt % of polymerized residues of an acrylate ester selected from the group consisting of methyl acrylate, ethyl acrylate, isopropyl acrylate, butyl acrylate and combinations thereof.

* * * * *